(12) United States Patent
Bolus

(10) Patent No.: US 11,402,414 B2
(45) Date of Patent: Aug. 2, 2022

(54) DIRECT CURRENT SENSING FOR COUPLED INDUCTORS

(71) Applicant: Apple Inc., Cupertino, CA (US)

(72) Inventor: Jonathan F. Bolus, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 287 days.

(21) Appl. No.: 16/820,658

(22) Filed: Mar. 16, 2020

(65) Prior Publication Data

US 2021/0285989 A1 Sep. 16, 2021

(51) Int. Cl.
*G01R 19/25* (2006.01)
*H02M 3/158* (2006.01)
*H02M 1/00* (2006.01)

(52) U.S. Cl.
CPC .......... *G01R 19/25* (2013.01); *H02M 3/1584* (2013.01); *H02M 1/0009* (2021.05)

(58) Field of Classification Search
CPC .... G01R 19/25; H02M 3/1584; H02M 1/0009
See application file for complete search history.

(56) References Cited

U.S. PATENT DOCUMENTS

| | | | |
|---|---|---|---|
| 6,424,129 B1* | 7/2002 | Lethellier | H02M 3/1588 323/272 |
| 7,233,132 B1* | 6/2007 | Dong | H02M 3/1584 323/272 |
| 8,228,014 B2 | 7/2012 | Jang et al. | |
| 9,281,748 B2 | 3/2016 | Barnette et al. | |
| 9,627,969 B2 | 4/2017 | Tschirhart et al. | |
| 2003/0102849 A1* | 6/2003 | Schiff | H02M 3/1584 323/222 |
| 2016/0187386 A1* | 6/2016 | El-Damak | G01R 19/10 324/126 |

* cited by examiner

*Primary Examiner* — Alvaro E Fortich
(74) *Attorney, Agent, or Firm* — Kowert, Hood, Munyon, Rankin & Goetzel, P.C.; Erik A. Heter; Dean M. Munyon

(57) ABSTRACT

A circuit and method for current sensing in DC-DC converters having coupled inductors is disclosed. A DC-DC converter includes a first and second inductors coupled to first and second switching nodes, respectively. The DC-DC converter further includes a current sensing circuit. The current sensing circuit includes a first current sensing circuit coupled to the first switching node and having a first sense node, and further includes a second sensing circuit coupled to the second switching node and having a second sense node. The circuit further includes a first capacitor coupled between the first sensing circuit and the second sensing circuit.

20 Claims, 5 Drawing Sheets

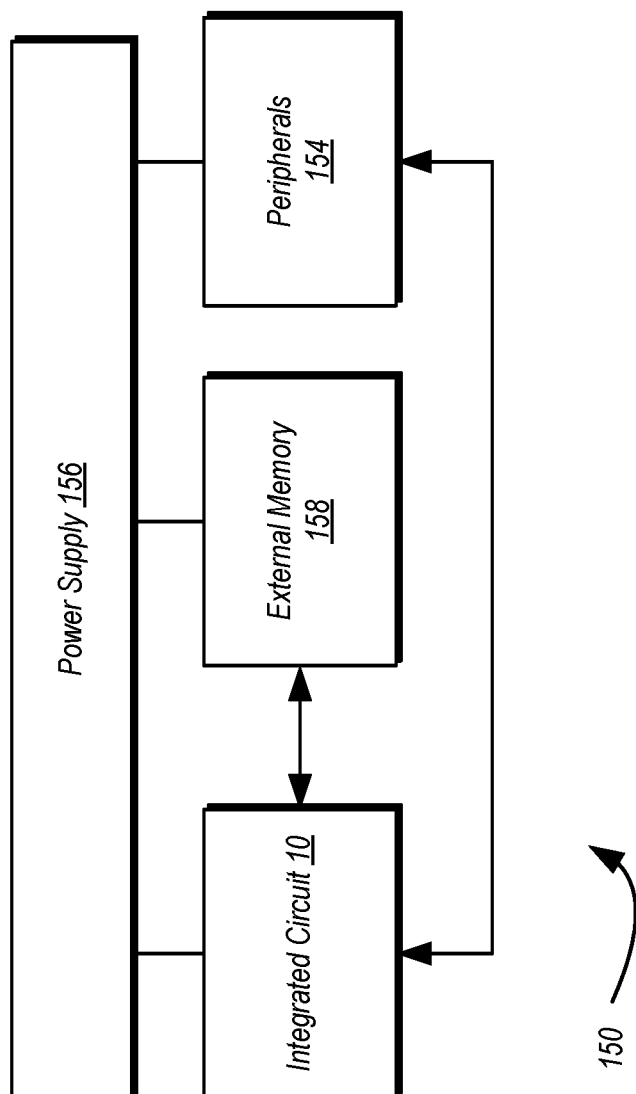

DIRECT CURRENT SENSING FOR COUPLED INDUCTORS

BACKGROUND

Technical Field

This disclosure is directed to electronic circuits, and more particularly, to DC-DC converter circuits.

Description of the Related Art

Computing systems may include one or more systems-on-a-chip (SoC), each of which may integrate a number of different functions onto a single integrated circuit. Various SoCs and/or various functional blocks on a given SoC may utilize power signals of different voltage levels. Since computing systems may include a single power source with a given output voltage level, one or more voltage converters or voltage regulators may be used to generate the power signals of different voltage levels.

Voltage regulation circuits implemented in a given computing system may be designed according to one of various design styles and types. Types of circuits for converting a DC power signal with a first voltage to a DC power signal with a second voltage include linear regulators and switching regulators. Buck converters, sometimes also referred to as buck regulators, are one example of a switching regulator.

Switching converters typically include inductors through which current pulses are sourced. The inductor current is sometimes measure in order to implement a current-control loop or a peak current limit. One method for measuring the inductor current is direct current resistance (DCR) sensing, which exploits the non-zero series resistance of the inductor to create a voltage proportional to the inductor current.

SUMMARY

A circuit and method for current sensing in DC-DC converters having coupled inductors is disclosed. In one embodiment, a DC-DC converter includes a first and second inductors coupled to first and second switching nodes, respectively. The DC-DC converter further includes a current sensing circuit. The current sensing circuit includes a first current sensing circuit coupled to the first switching node and having a first sense node, and further includes a second sensing circuit coupled to the second switching node and having a second sense node. The circuit further includes a first capacitor coupled between the first sensing circuit and the second sensing circuit.

In one embodiment, the first capacitor is coupled between the first sense node and the second sense node. The first sensing circuit further includes a second capacitor coupled between the first sense node and a ground node, while the second sensing circuit further includes a third capacitor coupled between the second sense node and the ground node. The inductors of the DC-DC converter, in the coupled conductor configuration, share their respectively generated magnetic fields with one another. The arrangement of the current sensing circuit allows for current sensing for both of the first and second inductors to enable, e.g., peak current monitoring and control.

BRIEF DESCRIPTION OF THE DRAWINGS

The following detailed description makes reference to the accompanying drawings, which are now briefly described.

FIG. 5 is a block diagram of one embodiment of an example system.

Figure 1:
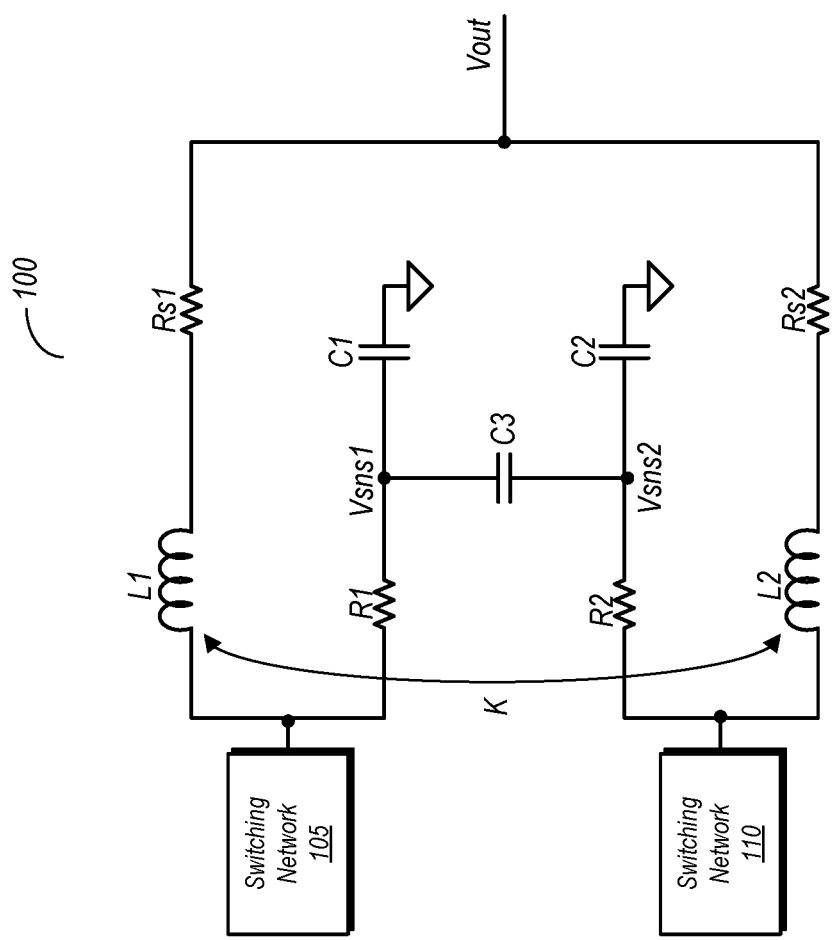
FIG. 1 is a schematic diagram illustrating a portion one embodiment of a DC-DC converter having a coupled inductor configuration and a corresponding current sensing network.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry, that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a DC-DC converter having a coupled inductor configuration with a current sensing network enabling individual current sensing for coupled inductor of a coupled inductor pair. In switching converters, it is often desirable to know the amount of current through the inductor(s) for various reasons, including implementing current control loops and peak current limiting. A common mechanism for measuring inductor current is direct current resistance (DCR) sensing, which utilizes the non-zero resistance of an inductor to generate a voltage that is proportional to the inductor current. In buck converters having coupled inductor configurations, the measurement of inductor current is complicated by the fact that the current in one inductor affects the current in the other inductor of a coupled pair. The present disclosure is directed to a circuit that enables DCR sensing of inductor current in coupled inductor pairs.

FIG. 1 is a schematic diagram illustrating a portion one embodiment of a DC-DC converter having a coupled inductor configuration and a corresponding current sensing network. In the embodiment shown, DC-DC converter 100 is arranged in a coupled inductor configuration. During operation, inductors L1 and L2 are magnetically coupled to one another, with a coupling factor of K. Both inductors have an equivalent series resistance, with the resistance Rs1 representative of the series resistance of inductor L1 while Rs2 is representative of the series resistance of inductor L2.

Both of inductors L1 and L2 are coupled to corresponding switching networks. Inductor L1 is coupled to switching network 105, while inductor L2 is coupled to switching network 110. As will be discussed below, each of the switching networks may alternately couple its respective inductor to an input voltage and ground, and thereby source current pulses through their respectively coupled inductors.

Each of the inductors, and their corresponding switching networks, is coupled to a corresponding current sensing circuit. A current sensing circuit to sense the current through L1 includes resistor R1 and capacitor C1. Similarly, a current sensing circuit to sense the current through L2 includes resistor R2 and capacitor C2. A capacitor C3 is coupled between these current sensing circuits, particularly between sense nodes. A current through L1 in the embodiment shown is proportional to a voltage on a first sense node, Vsns1. Current through L2 in this embodiment is proportional to a voltage on a second sense node, Vsns2. A capacitor C3 coupled between the two sense nodes may ensure that the voltages are proportional to the currents through their respective inductors.

For a single instance of the current sensing circuit absent the coupled inductor configuration, the proportionality of the sense voltage (e.g., corresponding to Vsns1) to the inductor current can be understood as follows. The voltages on the separate branches (e.g., top portion or bottom portion of the circuit in FIG. 1, minus the other portion) may be written as follows:

$$V_{SW} = L\frac{di_L}{dt} + R_S i_L \quad (1)$$

$$V_{SW} = V_{sns} + R_f i_{C1}. \quad (2)$$

In the above, $V_{SW}$ is the switching voltage, L is the inductance of the inductor, $i_L$ is the inductor current, $i_{C1}$ is the capacitor current (C1 in this case, but can be C2, which has an equal value), $V_{sns}$ is the voltage on the sense node, and $R_f$ is the resistance of the resistor in the branch (R1 or R2, which have equal values). The current through the capacitor C1 can be written as follows:

$$i_{C1} = C\frac{dV_{sns}}{dt}. \quad (3)$$

Accordingly, Equation 3 can be substituted into Equation 2 to yield the following:

$$V_{SW} = R_f C\frac{dV_{sns}}{dt} + V_{sns}. \quad (4)$$

Equating the derivative terms in Equations 1 and 4 and subtracting one from another yields the following relationship:

$$V_{sns} = R_s i_L \quad (5)$$

Accordingly, it can be seen that the sense voltage, $V_{sns}$, is equal to the voltage dropped by the series resistance of the inductor, $R_s i_L$. Accordingly, the sense voltage is proportional to the inductor current.

For the coupled inductor configuration of the circuit shown in FIG. 1, it is again noted that inductors L1 and L2 share magnetic fields, and thus the current through each inductor if affected by the current through the other. However, voltage loop equations can be written for the two branches of a single portion of the circuit due to symmetry of the circuit. Accordingly, the voltage loop equations for the upper portion of the circuit shown in FIG. 1, factoring in the effect of the other inductor, can be written as follows:

$$V_{SW1} = L \frac{di_{L1}}{dt} + kL \frac{di_{L2}}{dt} + R_S i_{L1} \quad (6)$$

$$V_{SW1} = V_{sns1} + R_f(i_{C1} + i_{C3}). \quad (7)$$

In the above, C3 is representative of the capacitor coupled between the sense nodes of the upper and lower portions of the circuit while k is representative of the coupling factor of inductors L1 and L2. The capacitor currents are given by the following:

$$i_{C1} = C_1 \frac{dV_{sns1}}{dt} \quad (8)$$

$$i_{C2} = C_2 \left( \frac{dV_{sns1}}{dt} - \frac{dV_{sns2}}{dt} \right). \quad (9)$$

The voltage loop equations can then be rewritten:

$$V_{SW1} = R_S i_{L1} + L \frac{di_{L1}}{dt} + kL \frac{di_{L2}}{dt} \quad (10)$$

$$V_{SW1} = V_{sns1} + R_f [C_1 + C_3] \frac{dV_{sns1}}{dt} - R_f C_3 \frac{dV_{sns2}}{dt}. \quad (11)$$

As with Equations (1) and (4) above, Equations 10 and 11 have the same form, and thus terms can be equated to show that the sense voltages are directly proportional to the inductor currents if the values of the resistors and capacitors are properly chosen:

$$V_{sns1} = R_S i_{L1} \quad (12)$$

$$V_{sns2} = R_S i_{L2} \text{ if} \quad (13)$$

$$R_S R_f [C_1 + C_3] = L \text{ and} \quad (14)$$

$$k = \frac{-C_3}{C_1 + C_3}. \quad (15)$$

Since the circuit shown in FIG. 1 is symmetrical, the C1 and C2 can be substituted for one another (since they have equal capacitance values), while either R1 or R2 can be substituted for $R_f$ (since they have equal resistance values). Thus, as demonstrated above, the addition of C3 between the sense nodes may ensure the proportionality of the sense voltages to the corresponding inductor currents for the coupled inductor configuration shown in FIG. 1. Furthermore, as shown in Equation 15, the value of C3 may be chosen based at least in part on the coupling factor K for inductors L1 and L2.

Figure 2:
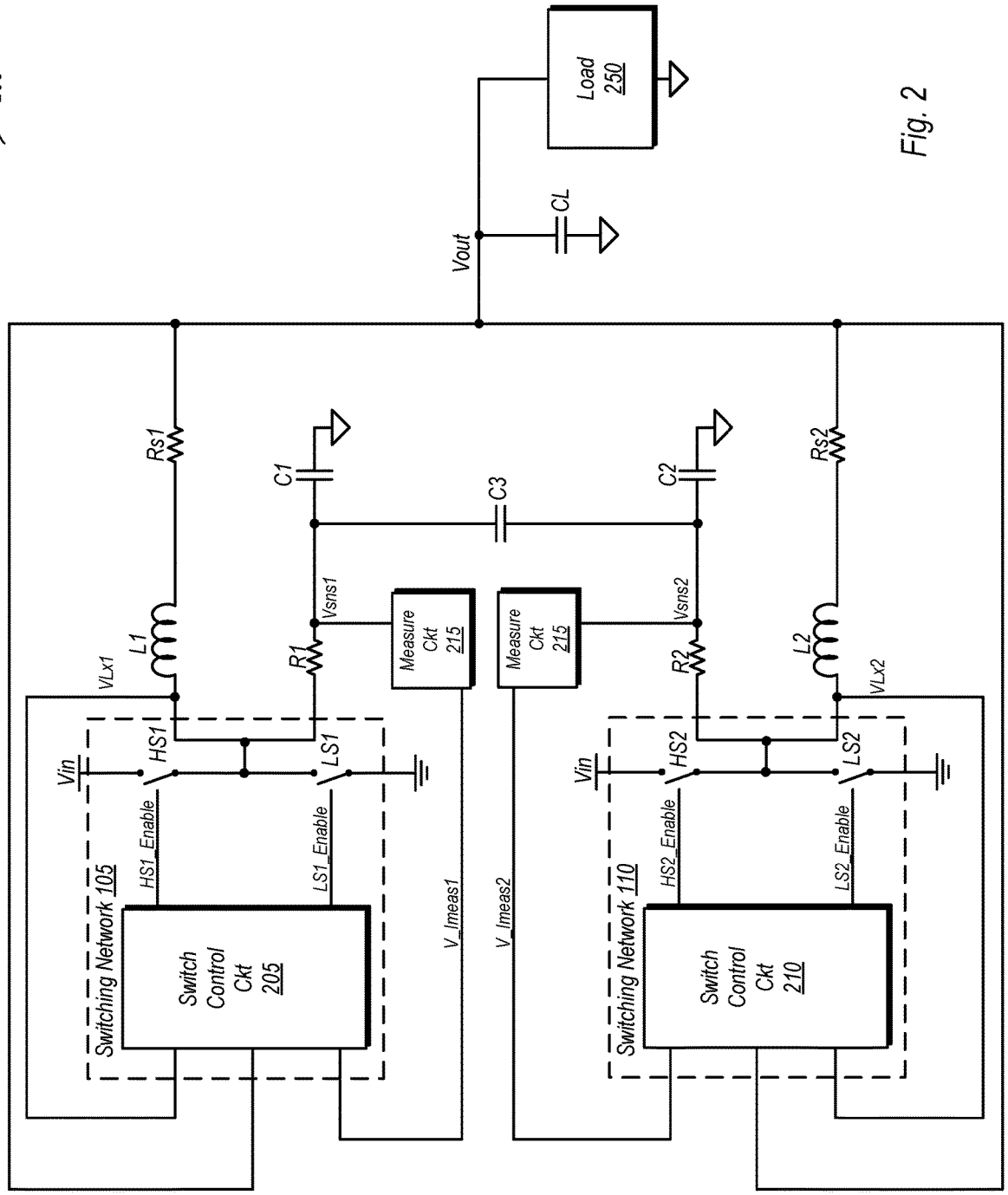
FIG. 2 is a schematic diagram further illustrating one embodiment of a DC-DC converter.

FIG. 2 is a schematic diagram further illustrating one embodiment of a DC-DC converter. In the embodiment shown, DC-DC converter 200 is a buck converter having a coupled inductor pair, namely inductors L1 and L2. It is noted that embodiments having multiple pairs of coupled inductors are possible and contemplated. DC-DC converter is configured to provide an output voltage, Vout, that is less than the input voltage, Vin. A load circuit 250 is coupled to receive the output voltage, Vout, from DC-DC converter 200. Load circuit 250 may be any type of functional circuitry that utilizes the supply voltage provided from DC-DC converter, including digital, analog, and/or mixed-signal circuitry. A load capacitor CL is also coupled between ground and the output voltage node of DC-DC converter 200.

In the embodiment shown, switching network 105 includes a switch control circuit 205, which is configured to control switches HS1 and LS1 using the control signals HS1_Enable and LS1_Enable, respectively. Switch HS1 is a switch that, when closed, couples inductor L1 to the input voltage, Vin. Switch LS1 is a switch that, when close, couples inductor L1 to ground. During operation, switch control circuit may alternately close switches HS1 and LS1. This type of operation alternately charges and drains L1, since the current through an inductor cannot change instantaneously. A portion of the input voltage is then transferred to Vout, with that portion being averaged out over time to a substantially DC value.

Switching network 110 operates in the same manner as switching network 105. In particular, switch control circuit 210 toggles the HS2_Enable and LS2_Enable signals to operate switches HS2 and LS2, respectively.

During operation of DC-DC converter 200, the timing of switching performed in switching network 105 and switching networks 110 may vary with respect to one another. For example, at times HS1 and HS2 may be concurrently closed (with the switches LS1 and LS2 also concurrently closed). More generally, the timing may vary with respect to modes of operation, as the switching of the high side (HS) and low side (LS) switches may be conducted according to a pulse width modulation (PWM) mode or a pulse frequency modulation (PFM) mode. Generally speaking, DC-DC converter 200 may operate in the PWM mode for higher load demand currents and the PFM for lower load demand currents.

Both switch control circuits 205 and 215 are coupled to receive respective feedback voltages from a terminal of their respectively coupled inductor. More particularly, VLx1 is coupled to switch control circuit 205 while a VLx2 is coupled to switch control circuit 210. These voltages may be used in control loops used to control the switching of their corresponding switches and thus regulate the output voltage. In the embodiment shown, switch control circuits 205 and 215 are also coupled to receive the output voltage, Vout. This output voltage fed back to switch control circuits 205 and 215 may be used in addition to, or in lieu of, the voltages VLx1 and VLx2 in the control loops that control the switching in the respective switching networks.

In the embodiment shown, the current sense circuits shown in FIG. 1 are included here. Furthermore, the embodiment shown here includes optional measurement circuits 215, including a first one coupled to Vsns1 and a second coupled to Vsns2. The measurement circuits may be used to measure the respective sense voltages and provide corresponding measurement voltages, V_lmeas1 and V_lmeas2 that are fed back to their corresponding switch control circuits. In some embodiments, Vsns1 and Vsns2 may be fed back directly to their corresponding switch control circuits, and thus the measurement circuits may not be included.

The sense voltages as noted above, are proportional to the currents through their corresponding inductor, may be used to, e.g., implement a current control loop, limit peak currents, and more generally, perform any function which utilize knowledge of the inductor currents. Alternatively, the measurement voltages (e.g., V_lmeas1) that are provided in this particular example may also be provided, and are also proportional to the corresponding inductor current, and may be used to implement the functions discussed herein.

Figure 3:
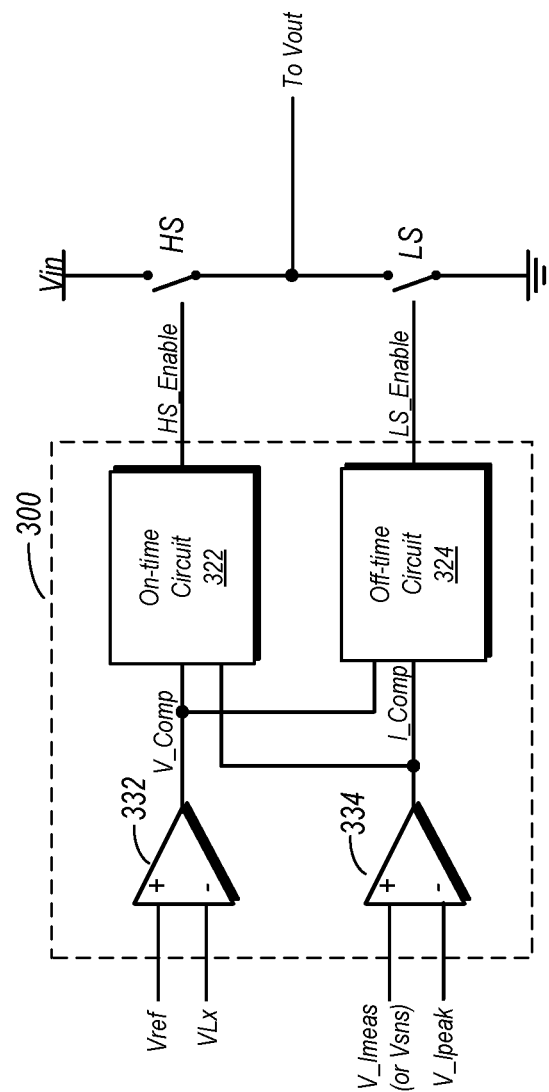
FIG. 3 is a block diagram of one embodiment of a control circuit for a switching network in a DC-DC converter.

FIG. 3 is a block diagram of one embodiment of a switch control circuit for a switching network in a DC-DC converter. In the embodiment shown, switch control circuit 300 is one possible example of the switch control circuits 205/210 shown in FIG. 2, although numerous other embodiments are possible and contemplated.

In the illustrated embodiment, control circuit 300 includes an on-time circuit 322 and an off-time circuit 324. On-time circuit 322 in the embodiment shown controls the state of the HS_Enable signal, and thus the switch HS. Off-time circuit 324 in the embodiment shown controls the state of the LS Enable signal, and thus the switch LS. In some embodiments, these two circuits may be consolidated into a single circuit. Using on-time circuit 322 and an off-time circuit 324 together, current pulses may be sourced by alternately closing the HS and LS switches.

In various embodiments, on-time circuit 322 and off-time circuit 324 may each implement a state machine or some other type of control circuitry, which may be implemented using analog or digital circuitry. The on-time circuit 322 and off-time circuit 324 may collectively control the modes of operation (e.g., PFM, PWM) of the DC-DC converter in which they are implemented. Furthermore, the on-time circuit 322 and off-time circuit 324 may collectively determine the length of a given current pulse (e.g., in the PWM mode), or the frequency at which current pulses are sourced (e.g., in the PFM mode).

Switch control circuit 300 in the embodiment shown includes a first comparator 332 and a second comparator 334. The first comparator 332 is coupled to compare an inductor voltage, VLx, and a reference voltage, Vref. The inductor voltage VLx is that which is taken from one terminal of the inductor, as shown in FIG. 2 (e.g., VLx1). The reference voltage is a voltage indicative of a desired output voltage to be provided by the DC-DC converter, and may be provided by a source external to switch control circuit 300 (e.g., a bandgap or other voltage generation circuit). Comparator 332 is configured to generate an output signal, V_Comp, based on a comparison of VLx and Vref. When VLx is greater than Vref, comparator 332 outputs a low, while a high is output when VLx is less than Vref. The V_Comp signal is provided to both the on-time circuit 322 and off-time circuit 324.

The second comparator 334 is used in this embodiment to implement a peak current limiting loop. Comparator 334 compares a voltage V_IPeak that corresponds to a desired peak inductor current to either V_lmeas or Vsns (depending on whether a measurement circuit, such as that shown in FIG. 2, is present). As previously noted, the voltages V_lmeas and Vsns are proportional to a current through a corresponding inductor. Thus, comparator 334 may be used to determine if the inductor current exceeds a desired peak value. When Vsns/Vlmeas is greater than V_IPeak, comparator 334 outputs the I_Comp signal as a high, otherwise it outputs a low. A high by I_Comp may indicate that the desired peak current has been exceeded. In one embodiment, a high by the I_Comp signal may cause termination of a current pulse by, e.g., the on-time circuit 322 causing the opening the HS switch while the off-time circuit 324 causing the closing of the LS switch.

Figure 4:
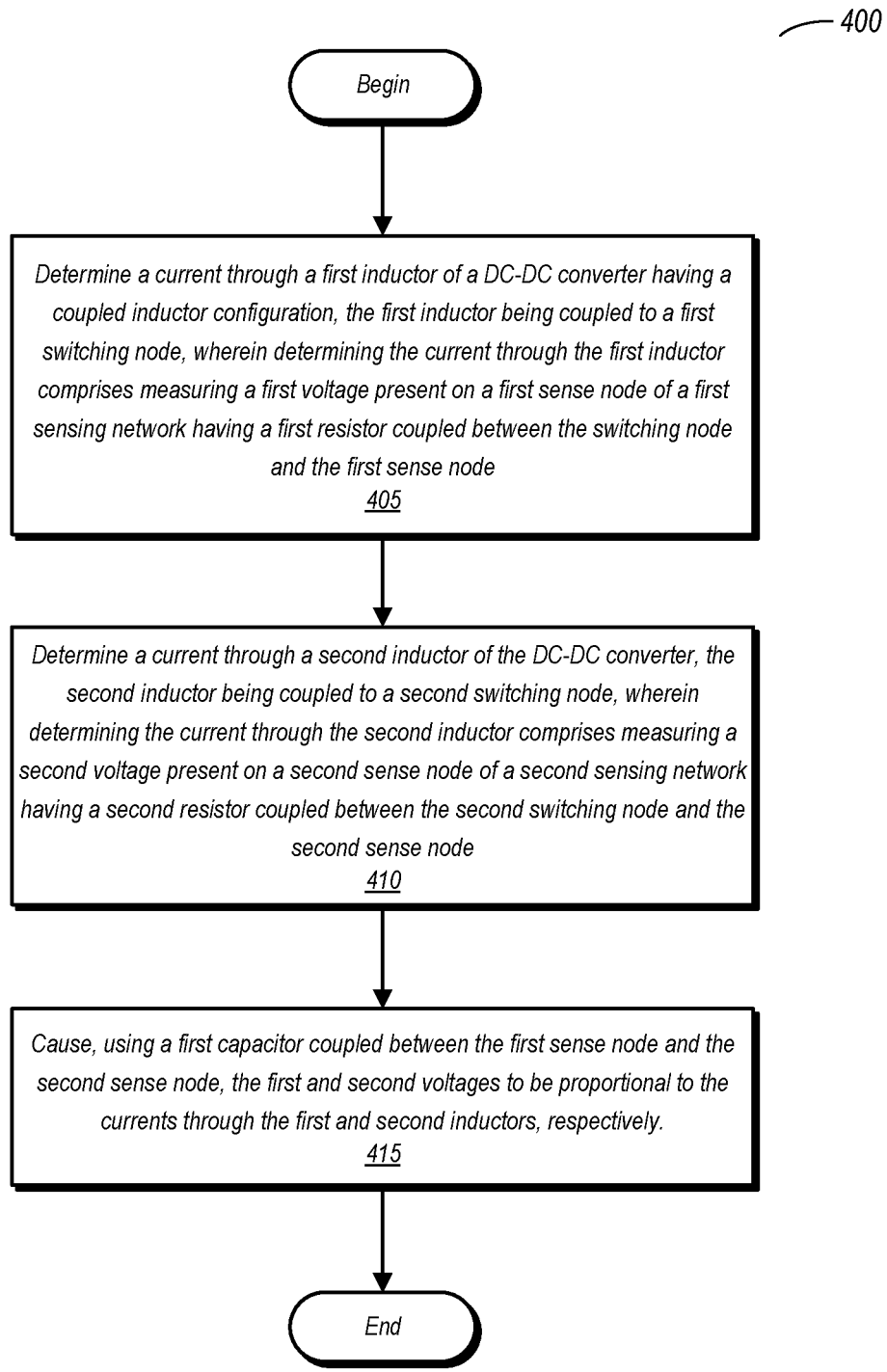
FIG. 4 is a flow diagram illustrating one embodiment of a method for performing current sensing in a DC-DC converter having a coupled inductor configuration.

FIG. 4 is a flow diagram illustrating one embodiment of a method for performing current sensing in a DC-DC converter having a coupled inductor configuration. Method 400 as illustrated in FIG. 4 may be performed by various embodiments of the circuits discussed above. Circuits not explicitly disclosed herein, but capable of carrying out Method 400, may also fall within the scope of this disclosure.

Method 400 begins with determining a current through a first inductor of a DC-DC converter having a coupled inductor configuration, the first inductor being coupled to a first switching node, wherein determining the current through the first inductor comprises measuring a first voltage present on a first sense node of a first sensing network having a first resistor coupled between the switching node and the first sense node (block 405). The method further includes determining a current through a second inductor of the DC-DC converter, the second inductor being coupled to a second switching node, wherein determining the current through the second inductor comprises measuring a second voltage present on a second sense node of a second sensing network having a second resistor coupled between the second switching node and the second sense node (block 410). Accurate determination of the currents requires that the voltages on the sense nodes be proportional thereto. Accordingly, the method further includes causing, using a first capacitor coupled between the first sense node and the second sense node, the first and second voltages to be proportional to the currents through the first and second inductors, respectively (block 415).

As various embodiment of the method are directed to operation of a DC-DC converter, the method may further include a first switch network alternating coupling of the first switching node between an input voltage node and a ground node and a second switch network alternating coupling of the second switching node between the input voltage node and the ground node. The first and second inductors are each coupled to an output voltage node, while the method further comprises the DC-DC converter providing an output voltage that is less than an input voltage received on the input voltage node.

With regard to the sensing networks, the first sensing network includes a second capacitor coupled between the first sense node and a ground node, and wherein the second sensing network includes a third capacitor coupled between the second sense node and the ground node. Furthermore, a capacitance of the first capacitor is based at least in part on a coupling factor of the first and second inductors.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments, one or more components of system 150 may include one or more instances of a DC-DC converter as discussed above. In particular, one or more instances of a DC-DC converter having a coupled-inductor configuration with current sensing circuits coupled thereto may be included in various portions of system 150, e.g., on integrated circuit 10 and/or peripherals 154, among other places.

Numerous variations and modifications will become apparent to those skilled in the art once the above disclosure is fully appreciated. It is intended that the following claims be interpreted to embrace all such variations and modifications.

What is claimed is:

1. A circuit comprising:
   a first switching network coupled to a first inductor at a first switching node;
   a second switching network coupled to a second inductor at a second switching node, wherein the first and second inductors are arranged to share respectively generated magnetic fields with one another; and
   a current sensing circuit coupled to the first and second switching nodes, wherein the current sensing circuit includes:
      a first current sensing network coupled to the first inductor at the first switching node;
      a second current sensing network coupled to the second inductor at the second switching node; and
      a first capacitor coupled between the first current sensing network and the second current sensing network.

2. The circuit of claim 1, wherein the first and second inductors are each coupled to an output voltage node.

3. The circuit of claim 1, wherein the first current sensing network includes a first resistor coupled between the first switching node and a first sense node, and wherein the second current sensing network includes a second resistor coupled between the second switching node and a second sense node.

4. The circuit of claim 3, wherein the first capacitor is coupled between the first sense node and the second sense node.

5. The circuit of claim 3, wherein the first current sensing network includes a second capacitor coupled between the first sense node and a ground node, and wherein the second current sensing network include a third capacitor coupled between the second sense node and the ground node.

6. The circuit of claim 1, wherein a capacitance value of the first capacitor is based at least in part on a coupling factor between the first inductor and the second inductor.

7. The circuit of claim 1, wherein a capacitance value of the first capacitor is based at least in part on respective capacitance values of second and third capacitors implemented in the first current sensing network and the second current sensing network, respectively.

8. The circuit of claim 1, wherein the circuit comprises a DC-DC converter having the first and second inductors arranged as a first pair in a coupled inductor configuration.

9. The circuit of claim 1, further comprising a first control circuit configured to control the first switching network and a second control circuit configured to control the second switching network.

10. The circuit of claim 1, wherein each of the first and second switching networks includes:
   a first transistor coupled between a corresponding one of the first and second switching nodes and an input voltage node; and
   a second transistor coupled between the corresponding one of the first and second switching nodes and a ground node.

11. A method comprising:
   determining a current through a first inductor of a DC-DC converter having a coupled inductor configuration, the first inductor being coupled to a first switching node, wherein determining the current through the first inductor comprises measuring a first voltage present on a first sense node of a first sensing network having a first resistor coupled between the first switching node and the first sense node;
   determining a current through a second inductor of the DC-DC converter, the second inductor being coupled to a second switching node, wherein determining the current through the second inductor comprises measuring a second voltage present on a second sense node of a second sensing network having a second resistor coupled between the second switching node and the second sense node; and
   causing, using a first capacitor coupled between the first sense node and the second sense node, the first and second voltages to be proportional to the currents through the first and second inductors, respectively.

12. The method of claim 11, further comprising:
   a first switch network alternating coupling of the first switching node between an input voltage node and a ground node; and
   a second switch network alternating coupling of the second switching node between the input voltage node and the ground node.

13. The method of claim 12, wherein the first and second inductors are each coupled to an output voltage node, and wherein the method further comprises the DC-DC converter providing an output voltage that is less than an input voltage received on the input voltage node.

14. The method of claim 11, wherein the first sensing network includes a second capacitor coupled between the first sense node and a ground node, and wherein the second sensing network includes a third capacitor coupled between the second sense node and the ground node.

15. The method of claim 11, wherein a capacitance of the first capacitor is based at least in part on a coupling factor of the first and second inductors.

16. An apparatus comprising:
a load circuit; and
a DC-DC converter coupled to provide an output voltage to the load circuit, wherein the DC-DC converter includes a first inductor and a second inductor arranged to share respectively generated magnetic fields with one another, and wherein the DC-DC converter further includes:
a first current sensing network coupled to the first inductor at a first switching node and including first sense node;
a second current sensing network coupled to the second inductor at a second switching node and including a second sense node; and
a first capacitor coupled between the first sense node and the second sense node.

17. The apparatus of claim 16, wherein the first current sensing network includes a first resistor coupled between the first switching node and the first sense node, and further includes a second capacitor coupled between the first sense node and a ground node, and wherein the second current sensing network includes a second resistor coupled between the second switching node and the second sense node, and a third capacitor coupled between the second sense node and the ground node.

18. The apparatus of claim 16, wherein a capacitance value of the first capacitor is based at least in part on a coupling factor between the first inductor and the second inductor.

19. The apparatus of claim 16, wherein the DC-DC converter further includes:
a first switching network coupled to the first switching node, wherein the first switching network is configured to alternate between coupling the first switching node to an input voltage node and coupling the first switching node to a ground node; and
a second switching network coupled to the second switching node, wherein the second switching network is configured to alternate between coupling the second switching node to the input voltage node and coupling the second switching node to the ground node.

20. The apparatus of claim 19, further comprising:
a first measurement circuit configured to measure a first voltage on the first sense node;
a first control circuit configured to control the first switching network based at least in part on the first voltage and a peak current threshold;
a second measurement circuit configured to measure a second voltage on the second sense node; and
a second control circuit configured to control the second switching network based at least in part on the second voltage and the peak current threshold.

* * * * *